US 6,736,723 B1

(12) United States Patent
Lane et al.

(10) Patent No.: US 6,736,723 B1
(45) Date of Patent: May 18, 2004

(54) ARCADE GAME HAVING INTERCHANGEABLE FEATURES

(75) Inventors: Michael S. Lane, Port Orange, FL (US); John F. Mendes, Jr., Ormond Beach, FL (US); David A. Wise, Daytona Beach, FL (US)

(73) Assignee: Bob's Space Racers, Inc., Daytona Beach, FL (US)

( * ) Notice: Subject to any disclaimer, the term of this patent is extended or adjusted under 35 U.S.C. 154(b) by 0 days.

(21) Appl. No.: 10/463,638

(22) Filed: Jun. 17, 2003

Related U.S. Application Data

(63) Continuation of application No. 09/713,759, filed on Nov. 15, 2000, now Pat. No. 6,579,174.
(60) Provisional application No. 60/165,962, filed on Nov. 17, 1999.

(51) Int. Cl.[7] .................................. A63F 13/00
(52) U.S. Cl. ........................ 463/6; 463/59; 463/46; 273/349; 273/445
(58) Field of Search .................. 273/349, 348, 273/440, 441, 442, 445, 454; 463/1, 6, 58, 59, 60, 62, 64, 46; 248/918; 312/223.1

(56) References Cited

U.S. PATENT DOCUMENTS

| | | | |
|---|---|---|---|
| 2,759,731 A | * 7/1956 | Quinn | 273/349 |
| 3,336,030 A | * 8/1967 | Martell et al. | 273/349 |
| 3,342,492 A | * 9/1967 | Barrett | 273/349 |
| 3,362,713 A | * 1/1968 | Miller | 463/60 |
| 3,572,711 A | * 3/1971 | Conklin et al. | 463/59 |
| 3,572,712 A | * 3/1971 | Vick | 463/60 |
| 3,650,533 A | * 3/1972 | Heppes | 273/349 |
| 4,040,622 A | * 8/1977 | Sinnott | 273/349 |
| 5,439,230 A | * 8/1995 | Mendes, Jr. | 273/349 |
| 5,573,243 A | * 11/1996 | Bartosik | 463/60 |
| 5,954,338 A | 9/1999 | Hampton | |
| 6,095,526 A | * 8/2000 | Cook, II | 273/349 |
| 6,135,884 A | * 10/2000 | Hedrick et al. | 463/20 |
| 6,199,861 B1 | * 3/2001 | Hume et al. | 273/118 R |
| 6,257,585 B1 | * 7/2001 | Mendes, Jr. | 273/442 |
| 6,306,041 B1 | * 10/2001 | Mendes, Jr. | 463/59 |
| 6,579,174 B1 | 6/2003 | Lane et al. | |

* cited by examiner

*Primary Examiner*—Jessica Harrison
(74) *Attorney, Agent, or Firm*—Standley Law Group LLP

(57) ABSTRACT

An arcade race game having interchangeable components allowing for the formation of various games. The object of the game is to hit a target causing actuation of the race progression indication device. The first player to reach a predetermined point activates a detection device which stops the game and signals the winner of the game. The game structure is preferably pre-wired to accommodate various games. The processor may also be programmed to accommodate various game formats.

17 Claims, 12 Drawing Sheets

ARCADE RISING WATERS

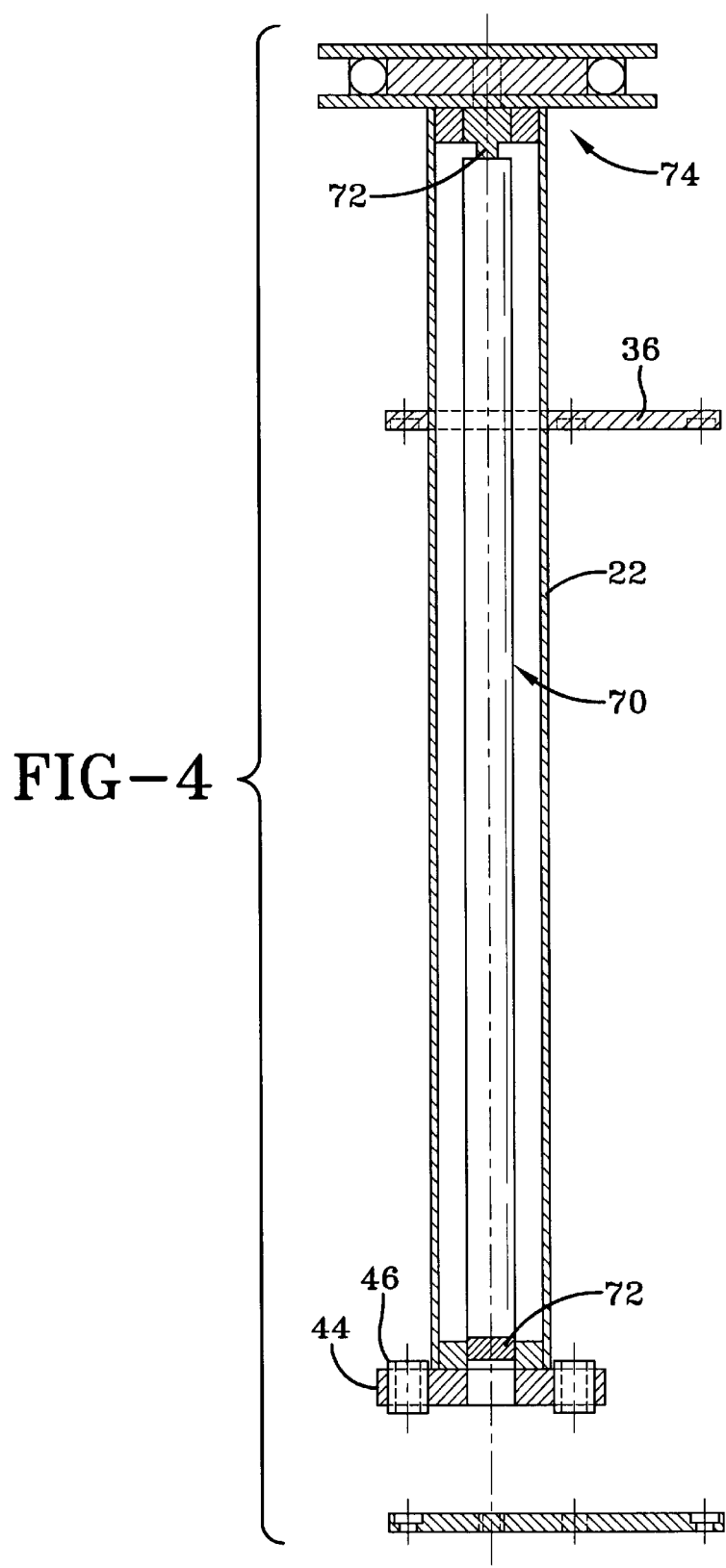

ARCADE GAME HAVING INTERCHANGEABLE FEATURES

INCORPORATION BY REFERENCE

This application is a continuation claiming priority benefits from presently copending U.S. application Ser. No. 09/713,759 filed Nov. 15, 2000, that will issue under U.S. Pat. No. 6,579,174 which claims priority benefits from U.S. Provisional Patent Application Serial No. 60/165,962 filed Nov. 17, 1999, both of which are incorporated herein by reference. In addition, this application hereby Incorporates by reference the subject matter of U.S. Pat. No. 5,439,230 to John F. Mendes, Jr.

SUMMARY AND BACKGROUND OF THE INVENTION

The present invention relates to the general field of arcade games, and more particularly, an arcade game having interchangeable modules or features.

The present invention consists of a game that involves players shooting water, air, light or any other equivalent means at a target where activation of the target causes the progression of a race progression indication device or means (e.g., an entire column may rise, an object on a vertical or horizontal plane may move, water may rise up a column, a progression of lights may be illuminated). The first player whose race progression indication device reaches a predetermined level or point is deemed the winner of the game (e.g., a column rises to a predetermined point or all the lights on a column are illuminated). The present game is unique over known columnar games in that the game of the present invention is adapted to be interchanged into many different games or distinct variations of the same game. For example, the base unit of the game may be fitted with various race progression indication devices (i.e., device that shows the progress of a particular player in the race) and/or winner indication devices (i.e., device that indicates the winner of the game or race) to form various arcade games. For example, one arcade unit may be used to form:

- a race game where the entire column rises to a predetermined level and where the winner's column has a ring of light that glows to indicate the winner; or
- a race game where the entire column rises to a predetermined level and where the winner's column has a round platform affixed to it which rotates (i.e., spins) to indicate the winner; or
- a race game having a stationary column, where the column is comprised of a plurality of lights or disks of lights placed along the length of the column, and where the lights are progressively illuminated to indicate race progress (i.e., as the target is hit by the player more lights are illuminated until one player illuminates all lights on his column thus winning the race); or
- a water race game having a stationary column which is progressively filled with water to indicate race progression, and where the player to fill his column with water is deemed the winner of the race (details of such a water game are disclosed in U.S. Pat. No. 5,439,230 to Mendes, Jr. which has been incorporated by reference).

The base unit of the game of the present is pre-wired to accommodate any one or more of the games indicated above. With the wiring of all accommodated games in place in the unit, the particular race progression indication device and/or winner indication device may be placed into the base unit and wired to the corresponding wire connections in the base unit to form a particular game. If another game, or variation of the same game is desired, the installed race progression indication device and/or winner indication device may be replaced with other race progression indication devices or winner indication devices to form another game. For example, instead of having a top platform that glows to indicate a winner, the column may be fitted with a spinning platform that spins to indicate the winner. Instead of having a rising column to indicate the progress of the player in a race, a stationary column with rising water may be used to indicate the progression of the player in the race.

The interchangeability of the present invention provides a flexible arcade game that may be configured for many different games. This "plug-and-play" feature allows the owner of the game to swiftly alter the unit to form a different game or variation of the same game. By having the ability to change the type of game, or features of the game, players are given an opportunity to experience various types of games or may choose to play a particular game that they find most enjoying. The owner of the game may configure the game according to the manner in which he or she believes will attract the most interest and players.

In addition to the features mentioned above, objects and advantages of the present invention will be readily apparent upon a reading of the following description.

BRIEF DESCRIPTION OF THE DRAWINGS

Novel features and advantages of the present invention, in addition to those mentioned above, will become apparent to those skilled in the art from a reading of the following detailed description in conjunction with the accompanying drawings wherein similar reference characters refer to similar parts and in which:

FIG. 4 illustrates one embodiment of a light disposed within a column of the rising column game;

DETAIL DESCRIPTION OF PREFERRED EMBODIMENT(S)

The preferred system herein described is not intended to be exhaustive or to limit the invention to the precise forms disclosed. They are chosen and described to explain the principles of the invention, and the application of the method to practical uses, so that others skilled in the art may practice the invention.

The present game is unique over known columnar games in that the game of the present invention is adapted to be interchanged into many different games or distinct variations of the same game. For example, the base unit of the game may be fitted with various race progression indication devices (i.e., device that shows the progress of a particular player in the race) and/or winner indication devices (i.e., device that indicates the winner of the game or race) to form various arcade games. For example, one arcade unit may be used to form:

- a race game where the entire column rises to a predetermined level and where the winner's column has a ring of light that glows to indicate the winner; or
- a race game where the entire column rises to a predetermined level and where the winner's column has a round platform affixed to it which rotates (i.e., spins) to indicate the winner; or
- a race game having a stationary column, where the column is comprised of a plurality of lights or disks of lights placed along the length of the column, and where the lights are progressively illuminated to indicate race progress (i.e., as the target is hit by the player more lights are illuminated until one player illuminates all lights on his column thus winning the race); or
- a water race game having a stationary column which is progressively filled with water to indicate race progression, and where the player to fill his column with water is deemed the winner of the race (details of such a water game are disclosed in U.S. Pat. No. 5,439,230 to Mendes, Jr. which has been incorporated by reference).

The following paragraphs describe one alternative embodiment of the present invention as a rising column race game. The subsequent paragraphs will describe how such one alternative embodiment may be changed, according to the present invention, to another alternative game embodiment.

Figure 1:
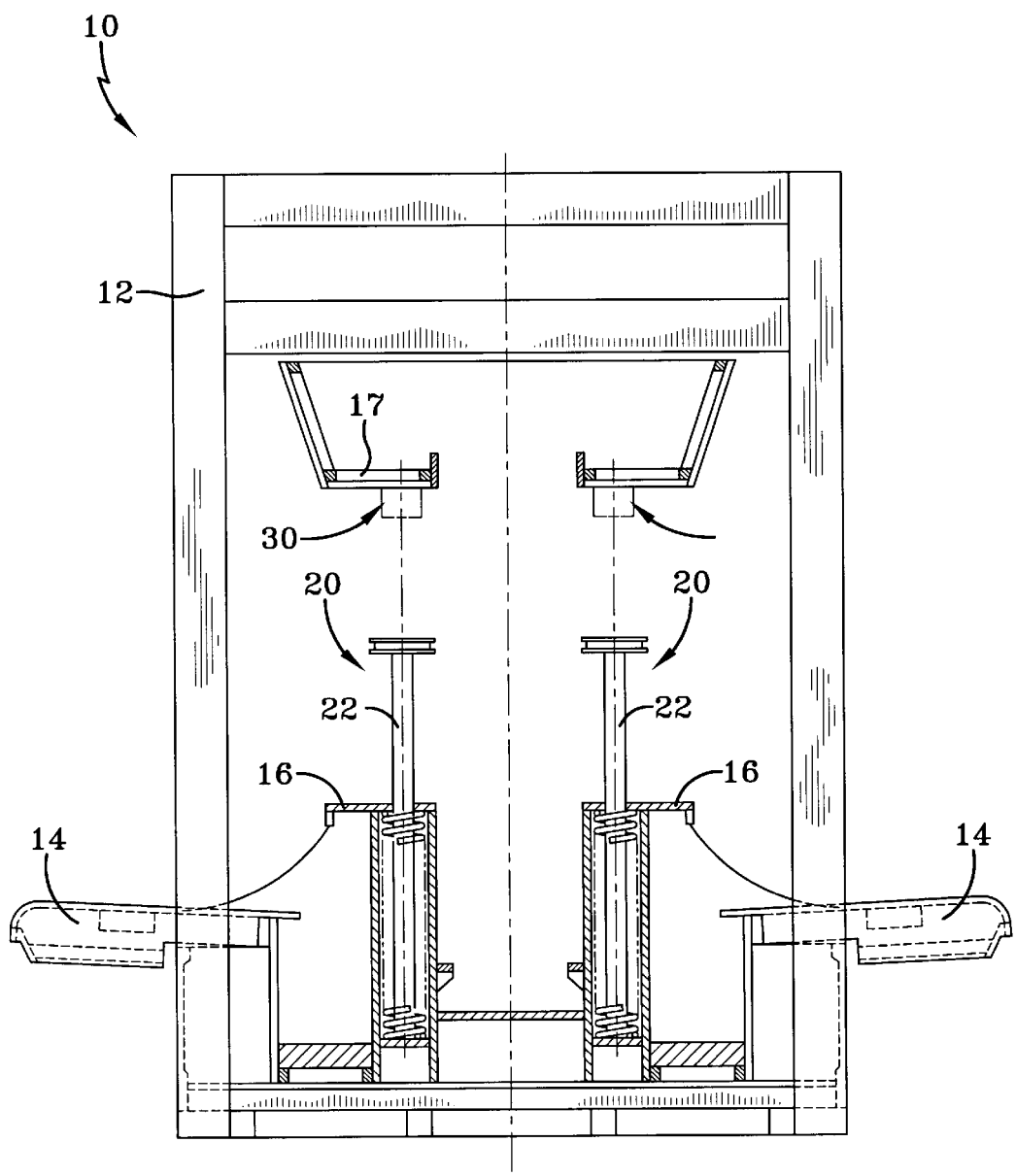
FIG. 1 illustrates an end elevational view of one embodiment of a columnar race game.

FIG. 1 illustrates an end elevational view of one embodiment of the columnar race embodiment 10 of the present invention. Referring to FIG. 1, the game is generally supported and resides in a structure having a frame 12. The structure is preferably comprised of a game console 14, game cabinet 16, a top ledge 17, and a roof 18.

Figure 2:
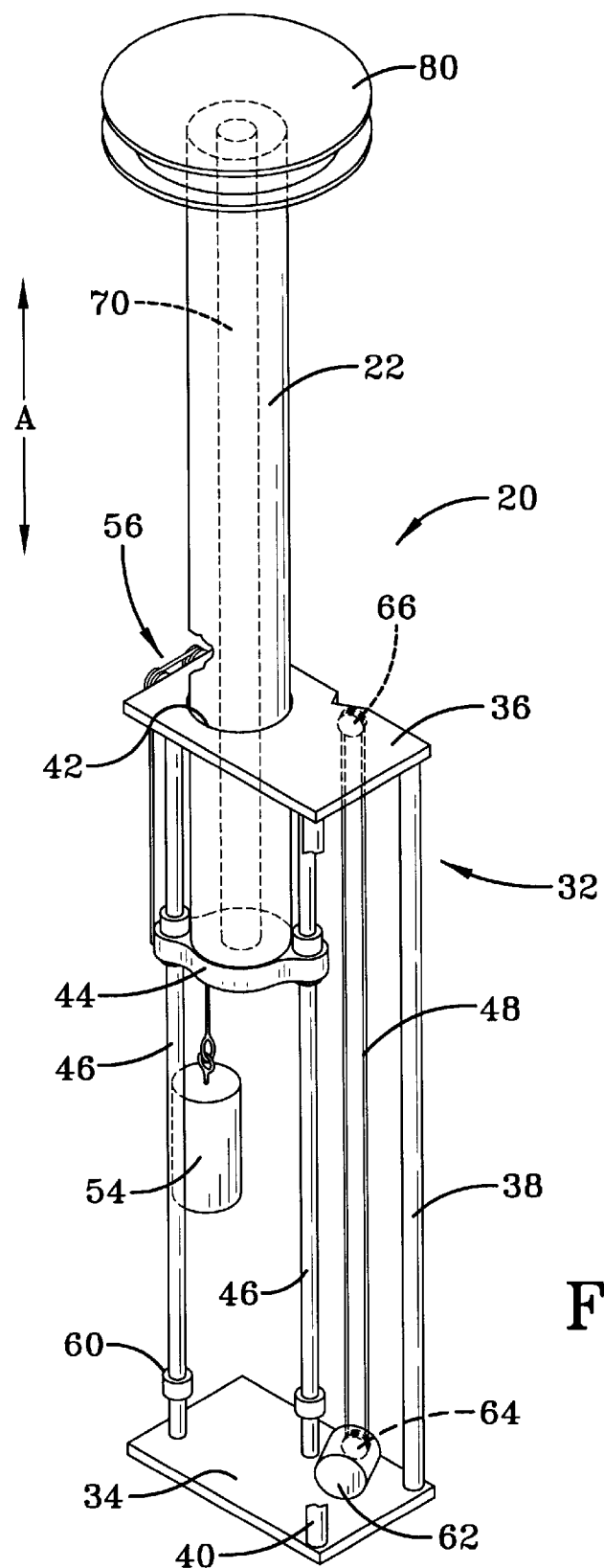
FIG. 2 illustrates one embodiment of a column structure of the present invention of a rising column game.

The columnar game embodiment of the present invention is comprised of a plurality of column structures 20, each having a movable column 22. FIG. 2 illustrates one embodiment of a column structure 20 of the present invention. The columns 22 are preferably adapted for movement in the vertical direction, illustrated by arrow A. The object of the game is to fire a gun or other projectile means to hit a target, or activation device, located on the game cabinet 16 (shown generally at 24). Hitting the target 24 causes actuation of the column 22 in the vertical direction from a down position to an up position. The first player having his or her column 22 reach the up position is the winner of the game. The players are preferably seated around the consoles 14 of the game structure (seats not shown in the figures).

It is appreciated that various types of targets or activation devices 24 may be used. Activation devices 24 may be formed with electronic switches, mechanical switches, optical switches, laser sensors, pressure sensors, electrical contacts, or any other device adapted to send an activation signal for controlling movement of the column 22. In a preferred embodiment, the activation device sends an electrical signal to a processing means which controls movement of the column 22. As an example, commercially available switches are available from Microswitch, Inc.

The device used to activate the activation device 24 may vary. For example, a water gun may be used. In other embodiments, a laser gun, an air gun, or a projectile gun may be used. In a preferred embodiment, the guns are attached on the consoles 14, one gun in front of each of the targets, or activation devices 24.

Detection devices are used in relation to each of the columns 22, for detecting when a column has reached the uppermost position. The detection device may be placed on the top ledge 17 or the cabinet 16 of the game structure. The detection device may be a switch, e.g. a microswitch, that causes activation of a signal when tripped. For example, a contact switch may be placed in relation to the column so that the column 22 activates the switch once the column 22 reaches the uppermost position. The detection device may signal another device that indicates the winner of the game. For example, flashing lights 30 may be placed in relation to each of the columns 22 to indicate a winner of the game. The detection device, when activated sends a signal to a processing system. The processing system determines which detection device was activated first and actuates the flashing lights 30 corresponding to the winner and stops the game. The processing system may be any microcontroller based system adapted to accept signals from multiple detection devices. It is appreciated that other "win" indication devices may be used such as alarms, sirens, spinning tops, glowing tops, lighted LEDs in predetermined patterns, etc.

Figure 3C:
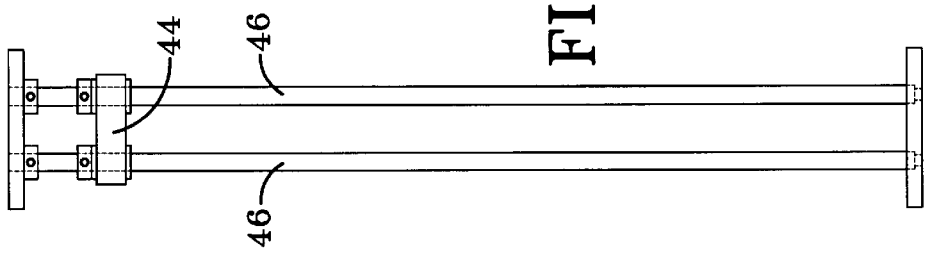
FIGS. 3A–3C illustrate various views of the slide assembly of the rising column game.
Figure 3B:
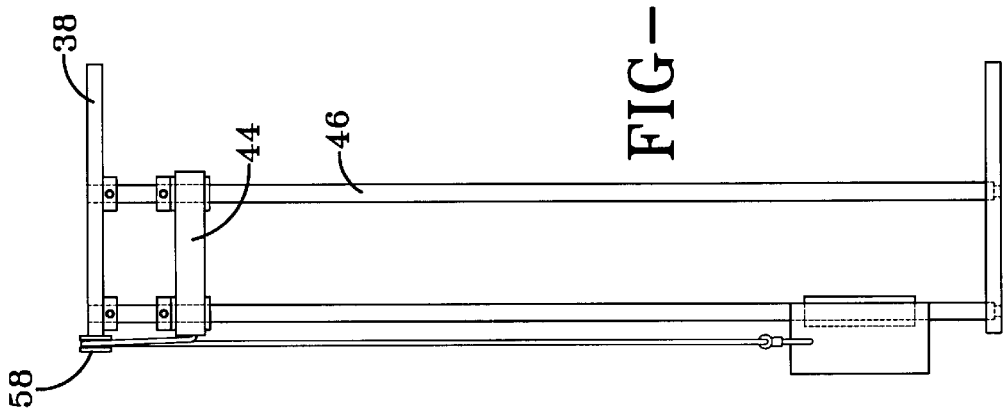
Figure 3A:

Referring to FIG. 2, one embodiment of the column structure 20 of the present invention is comprised of a column 22 movable in the vertical direction. The column 22 is supported in the vertical position by a frame structure shown generally at 32. The frame structure 32 of the embodiment of FIG. 2 is comprised of a lower stand 34, an upper stand 36, and a first and second upright 38, 40. The upper stand 36 has a hole 42 in which the column 22 is disposed. In the embodiment of FIG. 2, the column 22 is attached to a slide assembly 44. The slide assembly 44 is movably attached to two slide rods 46. FIGS. 3A–3C illustrate various views of the slide assembly 44 movably attached to the slide rods 46. The slide assembly 44 has a large opening 52 for engaging the column 22 and two smaller openings 50 for engaging the slide rods 46.

In the embodiment of FIG. 2, the column 22 is moved in the vertical direction by a chain 48 connected to the slide assembly 44. The chain 48 is connected to a motor 62. More specifically, the chain 48 is connected to a bottom sprocket 64 and an upper sprocket 66. In the embodiment of FIG. 2, the chain is connected to a bottom plate of the slide assembly 44. The motor 62 actuates the chain 48 which causes the slide assembly 44 and column 22 to move in the vertical direction. In one embodiment, the motor 62 is a bidirectional rotary stepper motor which causes the chain 48 to move in one direction when the motor moves in a first direction and causes the chain 48 to move in a second direction when the motor 62 moves in a second direction. Various other types of motors may be used to move the columns 22.

In one embodiment, a counterbalance 54 may be attached to the slide assembly 44, e.g., using a pulley system 56. The counterbalance 54 reduces the power needed to move the column 22 in the vertical direction. The pulleys 58 may be attached to the upper stand 36. In one embodiment, stops 60 are placed on predetermined portions of the slide rods 46 to prevent further movement of the column 22 past the stops 60.

In the rising column embodiment of FIG. 2, a light 70 may be disposed in the transparent column 22. FIG. 4 illustrates one embodiment of a light 70 disposed within the column 22. As illustrated, electrical sockets 72 are placed at interior ends 74 of the column 22 and the fluorescent light is disposed along the length of the column 22. The light 70 provides an aesthetically pleasing look while providing light to the game.

In the embodiment of the rising column of FIG. 2, a crown assembly or platform 80 is placed at a top end of the column 22. A neon light may be placed around the platform 80. The platform 80 is substantially flat which allows the placement of a prize or other ornament on the platform 80. As discussed, according to the present invention, that glowing platform may be interchanged with a spinning platform that indicates the winner of the game.

It is appreciated in light of the foregoing description and the drawings that features of the rising column structure 20 of the present invention may be varied without departing from the spirit of the invention. For example, the column 22 may be of various shapes, e.g., a tubular, rectangular, or any other elongated shape. A pulley system may be used to power the column 22 in the vertical direction as opposed to, the chain embodiment. The slide assembly 44 may be configured in different shapes and may be movably connected in various other ways. The range of movement of the column 22 may be varied based on the length of the slide rods 46 and the location of the stops 60.

Figure 6:
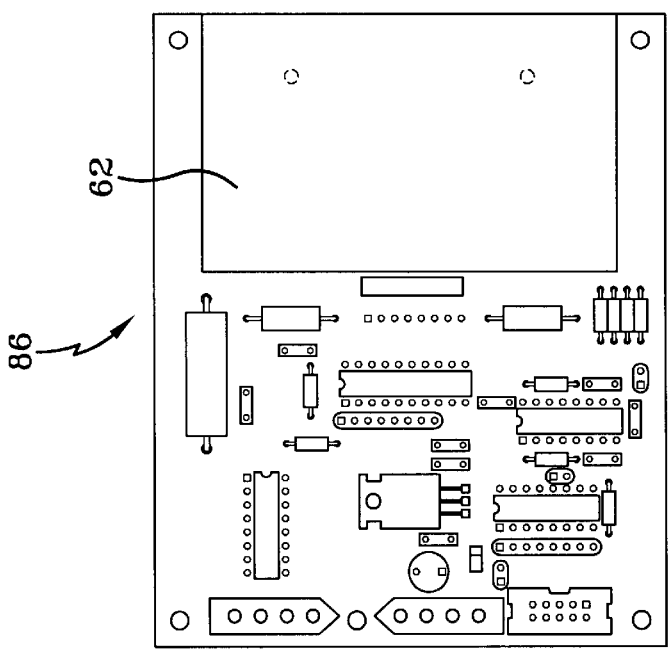
FIG. 6 illustrates one embodiment of the driver board of a rising column game.
Figure 5:
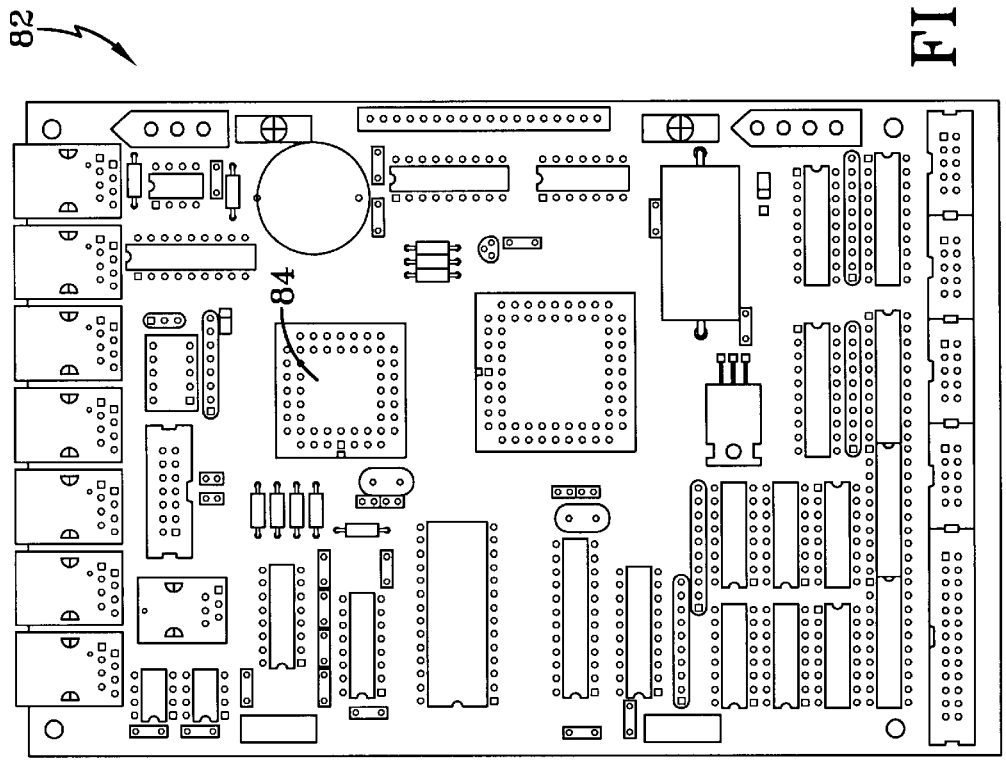
FIG. 5 illustrates one embodiment of a signal processing board of the present invention.

FIG. 5 illustrates one embodiment of a signal processing board 82 of the present invention. The board 82 may be based on a microcontroller system. For example, in the board 82 shown in FIG. 5, a 68HC11 Motorola chip 84 is used. The microcontroller may be programmed to achieve the purposes of the present invention. For example, a signal from the activation device 24 (due to hitting the target) is received at the inputs of the processor board 82. The processor board 82 processes the signal and among other things sends a signal to actuate movement of the column 22. For example, the processor board 82 may send a signal to a driver board 86 which drives the motor 62. FIG. 6 illustrates one embodiment of the driver board 86 of the present invention. Although in the embodiment of FIGS. 5 and 6 the processor board 82 and driver board 86 are separate, in an alternate embodiment, they may be placed on one board.

In operation, multiple players seated at the consoles 14 of the game structure use a water gun, or other projectile means, to actuate a target 24 or actuation means. Hitting the target 24 causes the columns 22 to rise up in the vertical direction from a down position. In one embodiment, each of the columns 22 rise up through holes located in the cabinet 16 of the game structure. The first column 22 that reaches a predetermined level, e.g., uppermost position, activates a detection means which causes actuation of a "winner" light located in relation to the column 22.

According to the present invention, the game structure or housing is pre-wired to accommodate the rising column embodiment just described as well as any other games the structure is intended to support (e.g., the rising column game with spinning platform, the rising water game or the illuminating LED game).

Figure 7:
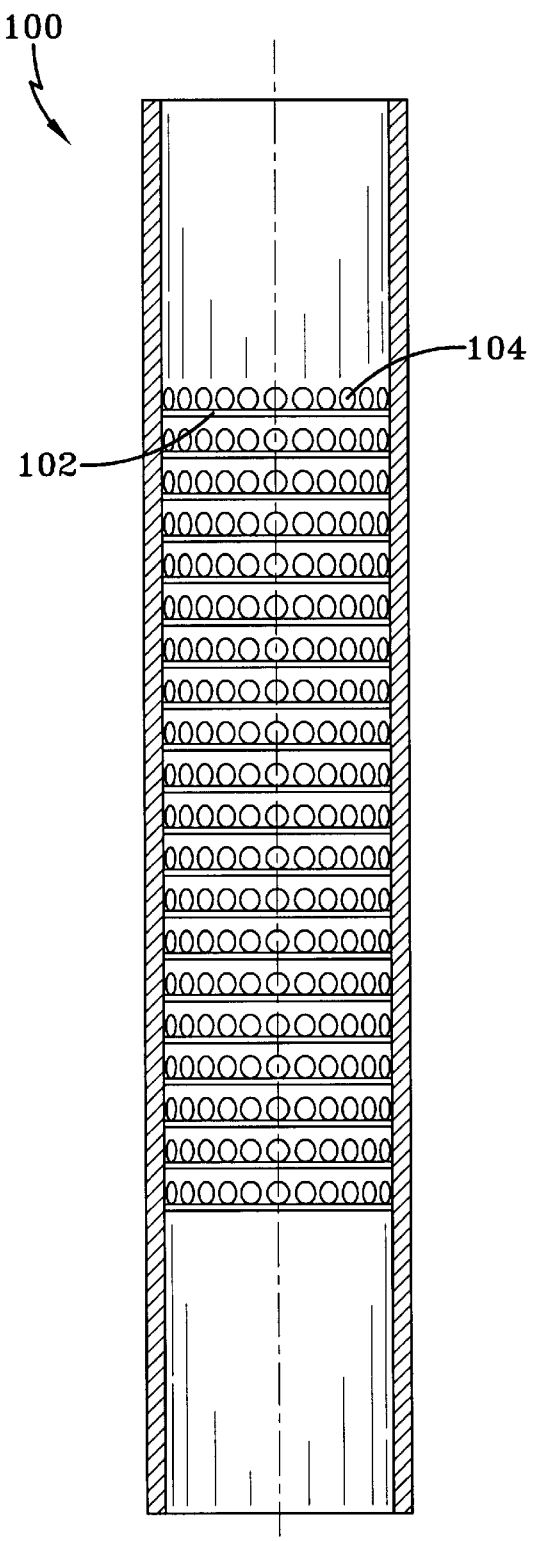
FIG. 7 illustrates one embodiment of the LED column of the illuminating LED race embodiment of the present invention.

The illuminating LED game consists of a stationary column 100 made of clear plastic, see FIG. 7. In the preferred embodiment, the tube 100 encases a stack of round printed circuit boards 102 populated with LEDs 104 on the outer edges. In one embodiment the LEDs on the introductory piece alternate red and yellow. Other color combinations may be used. Power is preferably conducted to the circuit boards 102 using metal stand-offs which also serve to evenly space the boards 104 along the length of the tube 100. Multi-color LEDs 104 allows for enhanced graphic displays during "game attract" modes. The boards can be programmed to light as a color unit to increase the graphic possibilities.

The tubes 100 can be installed alternatively to, and in place of, the rising columns 20 or rising waters game column. The LEDs 104 will be used as progress indicators during a race. The light boards 102 will preferably light sequentially until the last board (preferably at the top of the column 100) is lit. The first player to light all the boards wins. The system of the present invention may be programmed to display the word "WINNER" on the column via the LEDs 104 (preferably lengthwise down the column) to indicate the winner. The boards 102 can be programmed to rotate the word "WINNER" around the column 100 by selectively turning on and off the LEDs 102.

Figure 8:
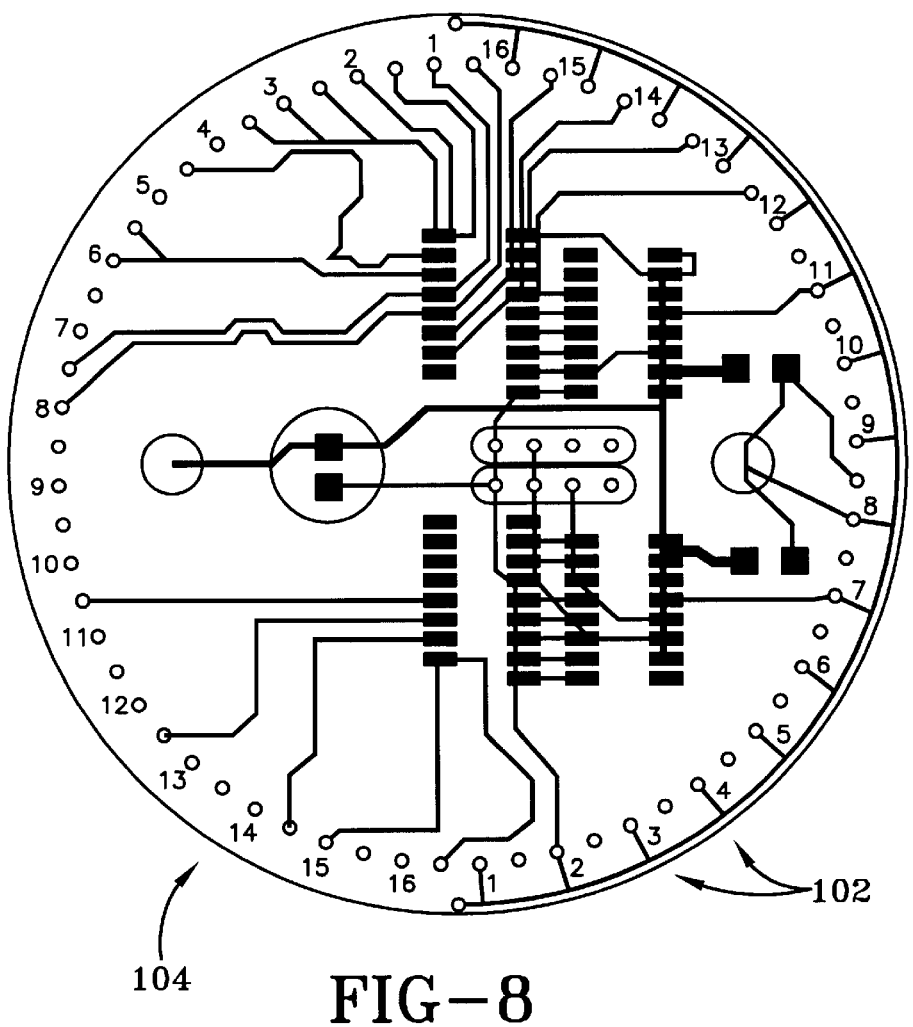
FIG. 8 illustrates a top plan view of one embodiment of the LED board of the present invention.
Figure 9:
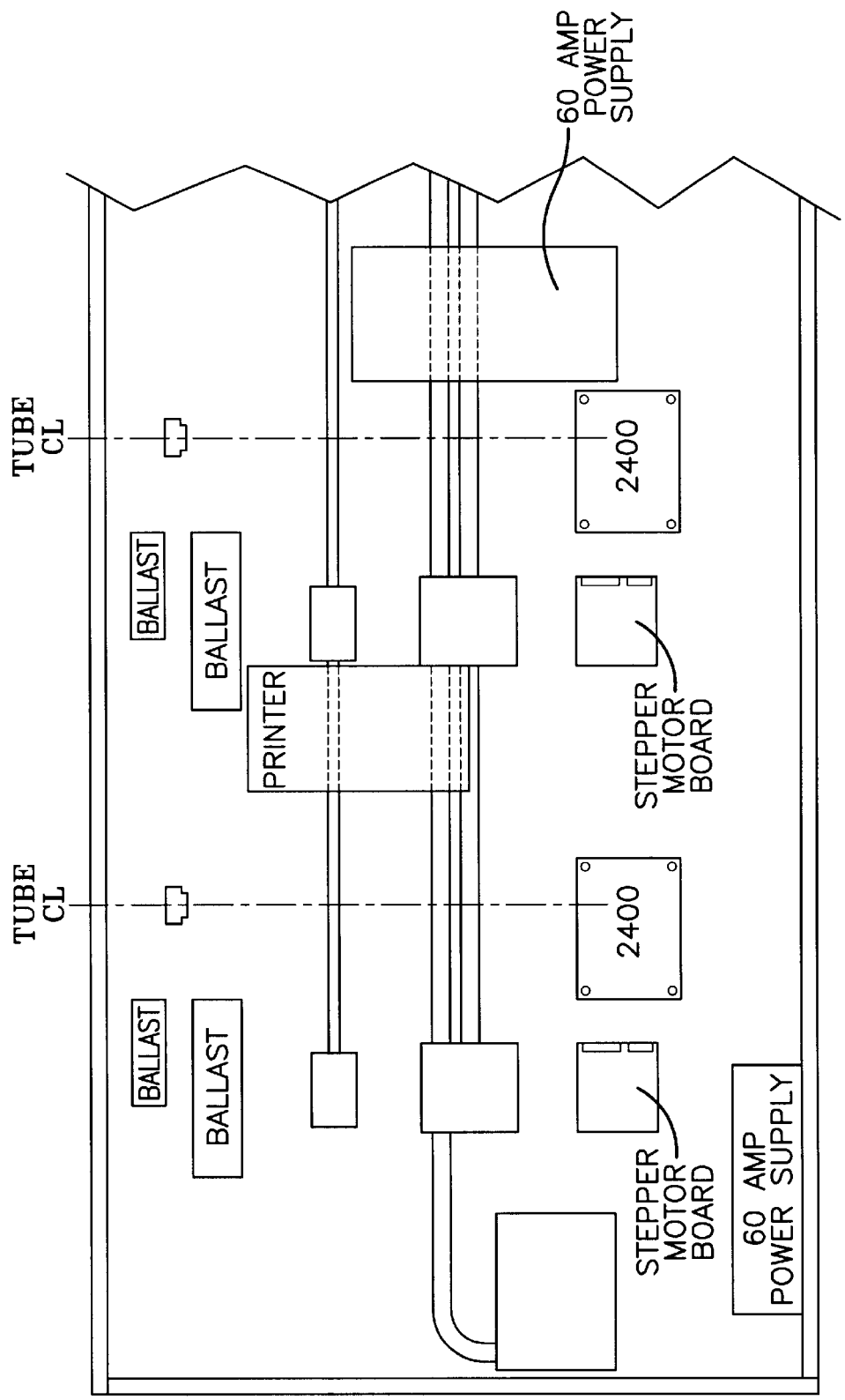
FIG. 9 illustrates a tank bank showing the ballast and stepper motor board placement for the present invention when used as the rising column game embodiment.
Figure 10:
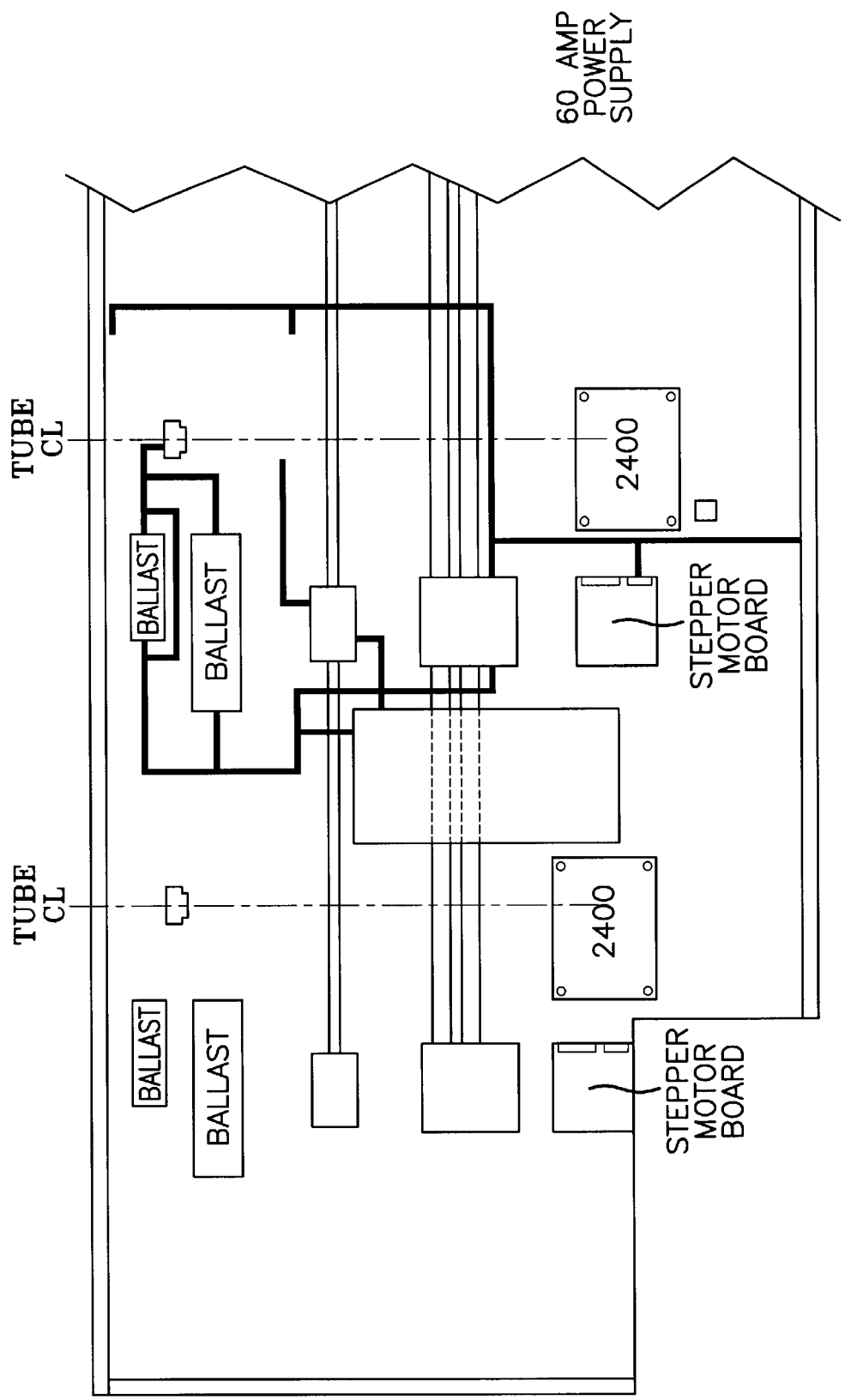
FIGS. 10 and 11 illustrate one embodiment of the wiring of the illuminating LED game embodiment of the present invention.
Figure 11:
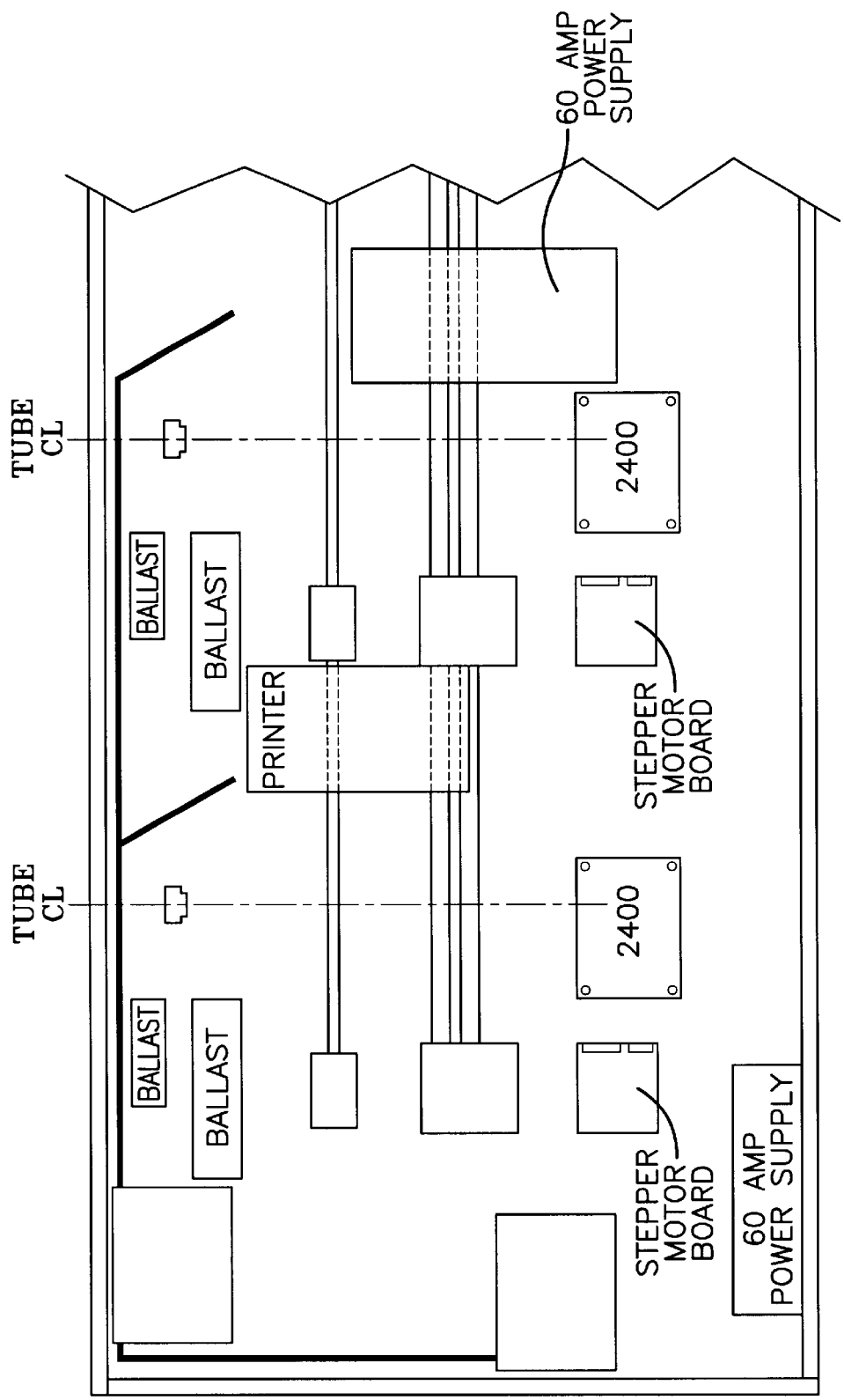

FIG. 8 illustrates a top plan view of one embodiment of the LED board 104 of the present invention. FIG. 9 illustrates a tank bank showing the ballast and stepper motor board placement for the present invention when used as the rising column game embodiment as previously described. When switching to the illuminating LED game, a ribbon cable is connected between the processing board (FIG. 5), e.g., a Bob's Space Racer 2400 board, and the LED board for controlling the actuation of the LEDs (see FIG. 10). A 60 Amp power supply is also connected to drive the lights (see FIG. 11). Furthermore, when switching from the rising column embodiment of FIG. 2 to the illuminating LED embodiment (where the column is stationary), the column of FIG. 2 is unscrewed from the assembly 44 and a column 100 with encased LED circuit boards 104 is attached. The stepper motor may be disconnected in the illuminating LED game embodiment as the column 100 and platform are preferably stationary.

When switching from the rising column game format or LED game format to the rising water format, the respective tubes for those games are replaced with the water tube of the rising waters game which allows pumped water to rise up the tube to actuate a water level detection means to signal a winner. The water tube is connected to a pressurized water pump for driving water up the tube (this water pump is not used in the other non-water based game formats.)

Figure 12:
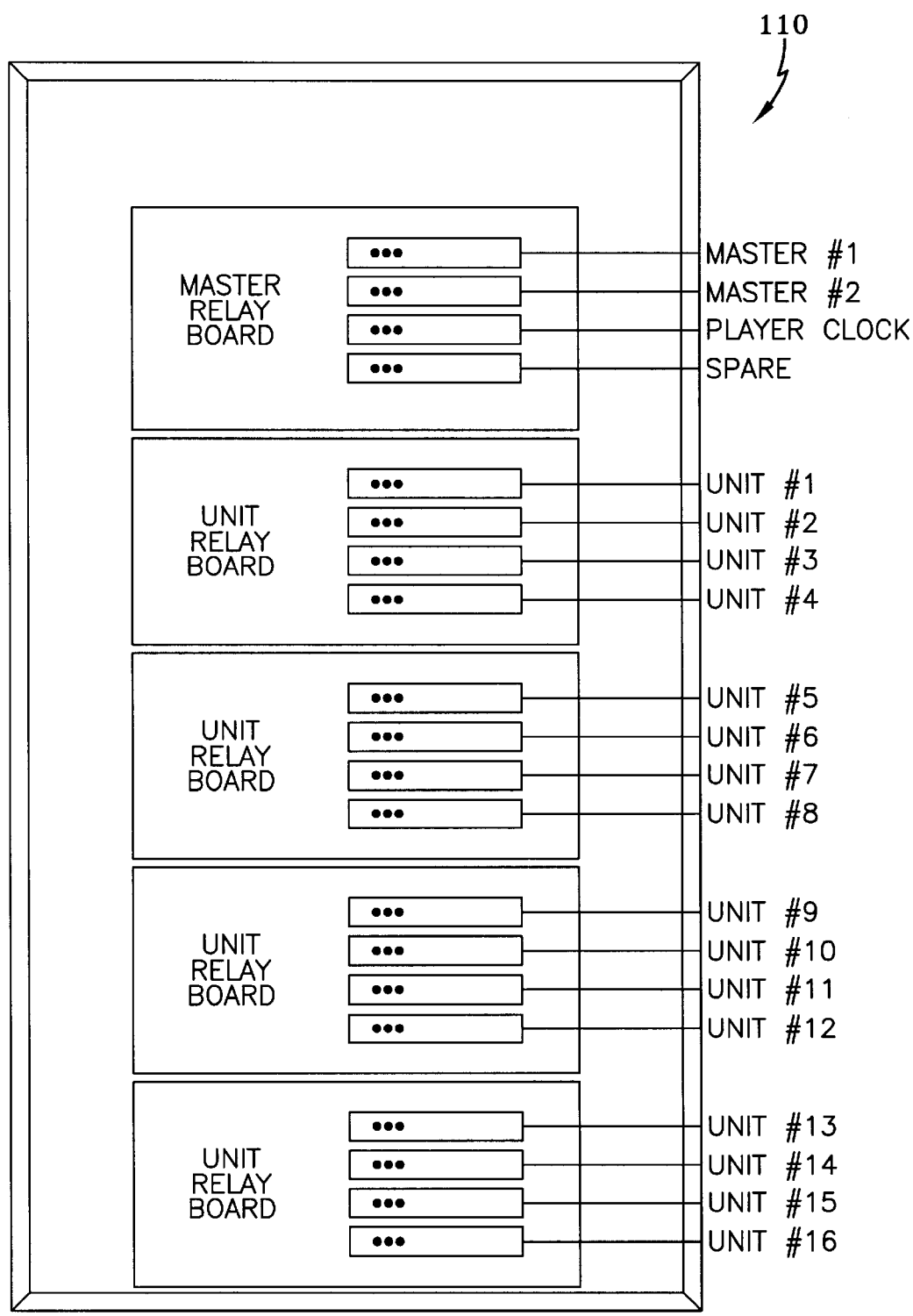
FIG. 12 illustrates one embodiment of the master controller with unit boards with modules to operate a plurality of game formats.
Figure 13:
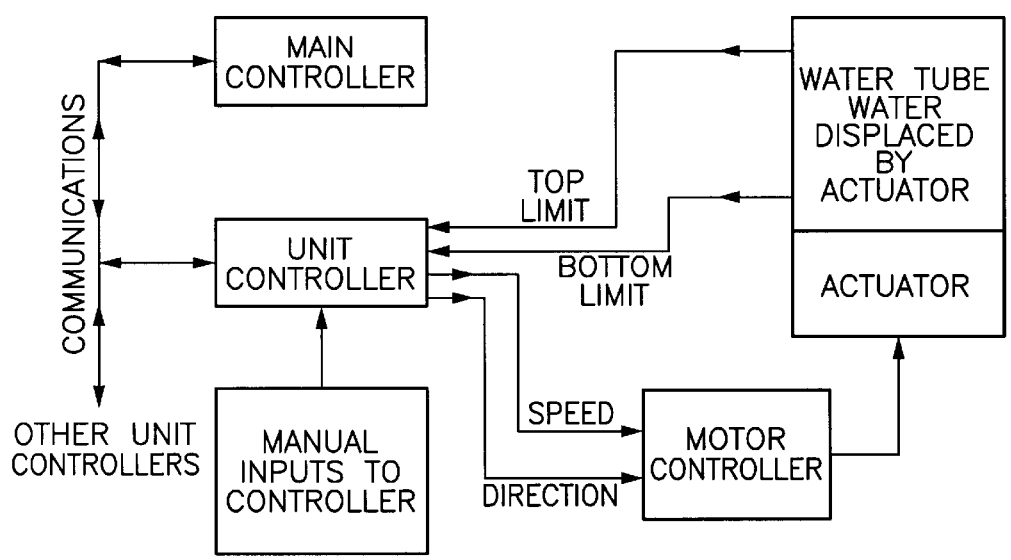
FIG. 13 illustrates a block diagram of the system for the rising water game format.

When switching between game embodiments, a processor-based master unit is used to control the game formats for each embodiment. The master controller 110 is programmed with each game setting by setting register settings according to each game format (See FIG. 12 illustrating one embodiment of the master controller 110 with unit boards with modules to operate a plurality of game formats, see FIG. 13 for connections of the master controller in the context of the rising water game format). When switching from one game format to the another, the register settings are also switched to match the game format (e.g., how long to signal a winner, how many tickets to pay out, motor speed adjustments if any, when to start the water pump for the rising water embodiment, time to start the sound, etc.). It should also be appreciated that the processing means of FIG. 5, associated with each of the players' units, are programmed to accomplish the objectives of each game.

Having shown and described a preferred embodiment of the invention, those skilled in the art will realize that many variations and modifications may be made to affect the described invention and still be within the scope of the claimed invention. Thus, many of the elements indicated above may be altered or replaced by different elements which will provide the same result and fall within the spirit of the claimed invention. It is the intention, therefore, to limit the invention only as indicated by the scope of the claims.

We claim:

1. A game configurable to accommodate multiple game formats, said game comprising:
   at least one first race progress indication device in a first game format;
   a base unit providing at least electrical communication with said at least one first race progress indication device;
   at least one target having an activation device in electrical communication with said base unit; and
   at least one player station having a player unit,
   wherein a player at said at least one player station uses said player unit to activate said activation device;
   wherein said activation of said activation device is displayed on said at least one first race progress indication device; and
   wherein said base unit is adapted to provide at least electrical communication with at least one second race progress indication device in a second game format.

2. A game according to claim 1, wherein said first and second race progress indication devices are removable and interchangeable.

3. A game according to claim 1, wherein said game is adapted to provide at least electrical communication with at least one third race progress indication device in a third game format.

4. A game according to claim 1, wherein said display of activation of said activation device is a vertical movement of a column.

5. A game according to claim 1, wherein said display of activation of said activation device is movement of an object on a horizontal or vertical plane.

6. A game according to claim 1, wherein said display of activation of said activation device is a fluid rising in a column.

7. A game according to claim 1, wherein said display of activation of said activation device is at least one light.

8. A game according to claim 1, wherein said display of activation of said activation device is a progression of illuminated lights.

9. A game according to claim 1, wherein said display of activation of said activation device is an indicator of a winner of said game.

10. A game according to claim 9, wherein said indicator of a winner of said game is selected from the group consisting of an alarm, siren, spinning platform, glowing platform, illuminated light, and illuminated LEDs in a predetermined pattern.

11. A game according to claim 1, wherein said activation device is selected from the group consisting of an electronic switch, mechanical switch, optical switch, laser sensor, pressure sensor, and electrical contact.

12. A game according to claim 1, wherein said player unit is selected from the group consisting of a water gun, laser gun, air gun, and projectile gun.

13. A game configurable to accommodate multiple game formats, said game comprising:
   at least one first race progress indication device in a first game format;
   a base unit providing at least electrical communication with said at least one first race progress indication device;
   a controller in electrical communication with said base unit;
   said controller having operational settings for at least said first game format;
   at least one target having an activation device in electrical communication with said base unit; and
   at least one player station having a player unit,
   wherein a player at said at least one player station uses said player unit to activate said activation device;
   wherein said activation of said activation device is displayed on said at least one first race progress indication device;
   wherein said base unit is adapted to provide at least electrical communication with at least one second race progress indication device in a second game format;
   wherein said first and second race progress indication devices are removable and interchangeable; and
   wherein said controller is adapted to have operational settings for said second game format.

14. A game according to claim 13, wherein said game is adapted to provide at least electrical communication with at least one third race progress indication device in a third game format.

15. A game according to claim 14, wherein said controller is adapted to have operational settings for said third game format.

16. A game according to claim 13, wherein said activation device is selected from the group consisting of an electronic switch, mechanical switch, optical switch, laser sensor, pressure sensor, and electrical contacts.

17. A game configurable to accommodate multiple game formats, said game comprising:
   a first game device in a first game format;
   a base unit for holding said first game device, said base unit providing communication with said first game device;
   at least one target in association with said first game having an activation device in communication with said base unit; and
   at least one player station having a player unit in association with said first game device, said player unit adapted to activate said activation device,
   wherein said base unit is adapted to provide communication with a second game device in a second game format that is adapted to be substituted for said first game device.

* * * * *